United States Patent [19]

Schendelman

[11] Patent Number: 5,075,252

[45] Date of Patent: Dec. 24, 1991

[54] INTERDIGITATED TRANS-DIE LEAD METHOD OF CONSTRUCTION FOR MAXIMIZING POPULATION DENSITY OF CHIP-ON-BOARD CONSTRUCTION

[76] Inventor: Richard Schendelman, 20950 Oxnard St., #2, Woodland Hills, Calif. 91367

[21] Appl. No.: 522,947

[22] Filed: May 14, 1990

[51] Int. Cl.⁵ .................... H01L 21/60; H01L 21/56; H01L 21/603; H01L 21/607
[52] U.S. Cl. .................................. 437/207; 437/211; 357/70
[58] Field of Search ............... 437/206, 220, 212, 207, 437/205, 209, 214, 217, ; 357/70, 69; 361/404; 174/51.2, 51.3

[56] References Cited

U.S. PATENT DOCUMENTS

| 4,496,965 | 1/1985 | Orcutt et al. | 357/70 |
| 4,733,014 | 3/1988 | Fierkens | 357/70 |

FOREIGN PATENT DOCUMENTS

| 58-33861 | 2/1983 | Japan . |
| 59-15955 | 5/1984 | Japan . |
| 61-18113 | 9/1986 | Japan . |
| 63-12443 | 4/1988 | Japan . |

Primary Examiner—Olik Chaudhuri
Assistant Examiner—David E. Graybill
Attorney, Agent, or Firm—John J. Posta, Jr.

[57] ABSTRACT

A novel implementation of a tape automated bonding process of attaching leads to a semiconductor die is disclosed which utilizes a method of attaching tape leads which extend across the interior surface of the die rather than radially outwardly from the die. Two-layer or three-layer tape construction is used, with the insulation being located between the top of the die and the leads. This technique enables lead placement on opposite sides of the die in interdigitated fashion, allowing die to be installed on a circuit board more closely adjacent than has previously been possible.

33 Claims, 6 Drawing Sheets

INTERDIGITATED TRANS-DIE LEAD METHOD OF CONSTRUCTION FOR MAXIMIZING POPULATION DENSITY OF CHIP-ON-BOARD CONSTRUCTION

IDENTIFICATION OF RELATED PATENT APPLICATION

This application is related to a concurrently filed copending patent application, U.S. Ser. No. 07/522,950, entitled "Interdigitated Trans-Die Lead Construction for Maximizing Population Density of Chip-On-Board Construction."

BACKGROUND OF THE INVENTION

Field of the Invention

The present invention relates generally to a tape automated bonding (TAB) process of attaching leads to a semiconductor die, and more particularly to a method of attaching tape leads which extend across the interior surface of the die rather than radially outwardly from the die, thus enabling lead placement on opposite sides of the die in interdigitated fashion allowing die to be installed on a circuit board more closely adjacent than has previously been possible.

Assembly technology used in the manufacture of integrated circuit chips has been evolving rapidly, moving away from traditional packaging as individual pin-mounted devices which are installed on printed circuit boards (PCB's). The maximum density of such pin-mounted devices is limited by the physical size of the package the die is mounted in, a constraint which the increasing complexity of circuits, particularly in memory applications, has found to be unacceptable.

The alternative has been found in chip-on-board (COB) technology, in which the semiconductor die is physically mounted on a printed circuit board. In chip-on-board construction, the chip is adhesively secured in position on usually the surface of a printed circuit board. Typically, in chip-on-board applications, gold wire bonding has then been used to connect terminal pads on the die to lands (bond pads) on the printed circuit board. This construction has increased packaging density, but presents several disadvantages.

First, wire bonding has distinct density limits, beyond which reliable construction is simply not physically possible. Since the wires extend upward at one end from the terminal pads on the die, and upward at the other end from the lands on the printed circuit board, they are subject to problems with adjacent wires shorting together in closely spaced construction. In addition, the height of the assembly is significantly increased by the construction, since the wires lead upward at their connections to the terminal pads on the die. The lead length and conductor shape in wire bonding technology are not optimized, resulting in large lead inductances and lead-to-lead capacitances.

Lead technology took a quantum leap forward with the development of tape automated bonding techniques. In tape automated bonding, a pattern of flat leads are created on a segment of tape. An inner-lead bonding (ILB) operation is carried out to connect the flat leads to the terminal pads on the die. The die and its attached leads are removed from the tape, and the leads are formed into a gull wing configuration. The die is then adhesively mounted onto a printed circuit board, and an outer-lead bonding (OLB) operation is carried out to connect the flat connectors to the lands on the printed circuit board.

For an excellent introduction to tape automated bonding, see "An Introduction to Tape Automated Bonding & Fine Pitch Technology," technical report SMC-TR-001, published by the Surface Mount Council in January, 1989. This technical report is hereby incorporated herein by reference.

The tape used in tape automated bonding may be single-layer tape, two-layer tape, or three-layer tape. Single-layer tape is a conductive foil without any insulating layer. Two-layer tape is a conductive layer adjacent an insulating layer. Three-layer tape uses an adhesive layer between a conductive layer and an insulating layer. Additional special application tapes may be used with multiple metal layers.

The metal layer is made into a pattern of leads using photo imaging and etching processes well known in the art. The inner-lead bonding requires a procedure known as "bumping," which is the formation of a raised metal feature on either the die terminal pads or on the ends of the flat leads on the tape to be attached to the terminal pads on the die. The tape is positioned with respect to the die, and a sequential inner-lead bonding operation may be performed using either thermocompression, thermosonic bonding, ultrasonic bonding, laser bonding, or reflow bonding. Alternately, simultaneous inner-lead bonding may be performed using either thermocompression bonding or reflow bonding. At this point the die may be tested using the newly attached leads.

At this point the die together with the leads and the portions of the insulating layer adjacent the die (hereinafter called the leaded die) may be excised from the tape. The leads may then be formed in gull wing fashion if desired, extending down from the top of the die. At this point, the unattached ends of the leads are also formed for attachment into a flat array. If desired, the die may be encapsulated with a protective coating to protect it against contaminants and the environment.

The leaded die may then be installed on a printed circuit board. Typically, an adhesive is used to retain the die in place on the printed circuit board, and to provide heat sinking between the die and the printed circuit board. An outer-lead bonding operation is then performed to attach the flat leads to the lands. This bonding operation may be performed a lead at a time using a single-point bonder and thermocompression bonding, thermosonic bonding, ultrasonic bonding, reflow, or the use of conductive adhesives. Alternately, simultaneous bonding of all of the leads to the lands may be performed using thermocompression bonding, reflow bonding, or the use of conductive adhesives.

The use of chip-on-board technology and tape automated bonding technology together has thus allowed a quantum leap in miniaturization efforts, both in board area and in component height due to the gull wing lead configuration. The problems associated with wire bonding are eliminated, with lead density increasing dramatically and shorting being eliminated as a problem. Lead inductances are lowered, and lead-to-lead capacitance is minimized. Additional advantages are stronger lead connections, the ability to pretest and burn in the chip before installation on the printed circuit board, the requirement of less gold than wire bonding and the ability to mass bond, both of which lower costs, and the enhancement of high speed operation due to minimization of lead length.

Thus, tape automated bonding as used to implement chip-on-board construction has resulted in a package which has been thought to absolutely maximize packaging density, minimizing the board space needed to implement a particular design. The area required to install a chip and its leads is the actual area of the chip, plus the area required by the leads surrounding the chip. In chips having a large number of leads, the leads radiate outwardly from all sides of the chip. In chips having a smaller number of leads, the leads may emanate from two opposite sides of the chip.

One area in which is has become increasingly more important to concentrate a large number of chips in the smallest area possible is in the memory expansion board area. Personal computers increasingly have had applications in which it is desirable to have a large amount of memory. The race to put the most memory into the least space has been incredibly competitive, and has used the chip-on-board and tape automated bonding technologies described above.

It is accordingly the primary objective of the present invention that the chip-on-board and tape automated bonding technologies be utilized to further minimize the board area required to mount chips such as, for example, memory chips. It is thus an objective of the present invention to reduce to an absolute minimum the board space required to mount chips, thereby maximizing density to the greatest degree possible. In increasing the density of chip mounting, none of the advantages obtained through tape automated bonding may be sacrificed to any degree. The cost of the increased density must be minimal to enable that more compact designs may be sold at a price not significantly higher than competing lower density designs. It is also an objective that all of the aforesaid advantages and objectives be achieved without incurring any substantial relative disadvantage.

SUMMARY OF THE INVENTION

The disadvantages and limitations of the background art discussed above are overcome by the present invention. With this invention, tape automated bonding leads emanate from a chip in a fashion enabling interdigitation. Interdigitation is defined as the leads on one side of a first chip meshing with the leads on the adjacent side of a second chip. Thus, the space between two chips requires only room to mount a single set of leads rather than two adjacent sets of leads. A single row of lands is used in the area between the two chips, with leads from both of the chips being connected to the lands.

In the preferred embodiment, three sets of leads emanate from opposite sides of a chip. On a first side of the chip, leads emanate from the top portion of the first side of the chip and the bottom portion of the first side of the chip. On a second side of the chip, leads emanate from the central portion of the second side of the chip. Thus, it will be appreciated by those skilled in the art that when two chips of this design are placed side-to-side on a printed circuit board, the leads emanating from the central portion of the second side of the first chip will be located between (interdigitated between) the leads emanating from the top and bottom portions of the first side of the second chip.

Alternative designs have leads placed in different positions also enabling interdigitation. In a first alternate embodiment, the leads on a first side of a chip emanate from the bottom half of the first side of the chip. Leads on a second side of the chip emanate from the top half of the second side of the chip. In a second alternative embodiment, the leads on both a first side and a second side of a chip emanate from the bottom half (or top half) of the chip. Alternating chips are inverted when the chips are mounted.

Unless a chip is specifically designed with its terminal pads located to accommodate the lead locations described above, current technology will not allow such construction. The key to the interdigitated lead design of the present invention is an expansion of tape automated bonding technology to place portions of the flat leads above the surface of the die rather than merely radially emanating from the sides of the die. Thus, the present invention uses a lead circuit design partially over the surface of the die to facilitate having leads connected at any point on the die emanate from the two opposite sides of the die in the fashion described above.

Thus, the present invention allows standard die designs to be used in the construction of leaded die having interdigitated leads. This interdigitation enables the absolute minimization of the area required by each chip, maximizing density of an assembled device In fact, the printed circuit board area required for each chip is reduced by at least approximately 20 percent.

It may therefore be seen that the present invention teaches an expansion of the chip-on-board and tape automated bonding technologies which is utilized to further minimize the board area required to mount chips. The present invention thus reduces to an absolute minimum the board space required to mount chips, thereby maximizing density to the greatest degree possible. In increasing the density of chip mounting, none of the advantages obtained through tape automated bonding are sacrificed to any degree. The cost of the increased density is minimal, thus enabling the more compact designs to be sold at a price not significantly higher than competing lower density designs. Finally, all of the aforesaid advantages and objectives are achieved without incurring any substantial relative disadvantage.

DESCRIPTION OF THE DRAWINGS

These and other advantages of the present invention are best understood with reference to the drawings, in which.

DETAILED DESCRIPTION OF THE PREFERRED EMBODIMENT

The preferred embodiment of the present invention is illustrated herein with regard to an exemplary design useful to illustrate the principles of the present invention. The construction of a leaded die for installation on a printed circuit board will be described. It will be apparent to those skilled in the art that a number of changes in implementation may be made without departing from the spirit of the present invention.

Figure 1:
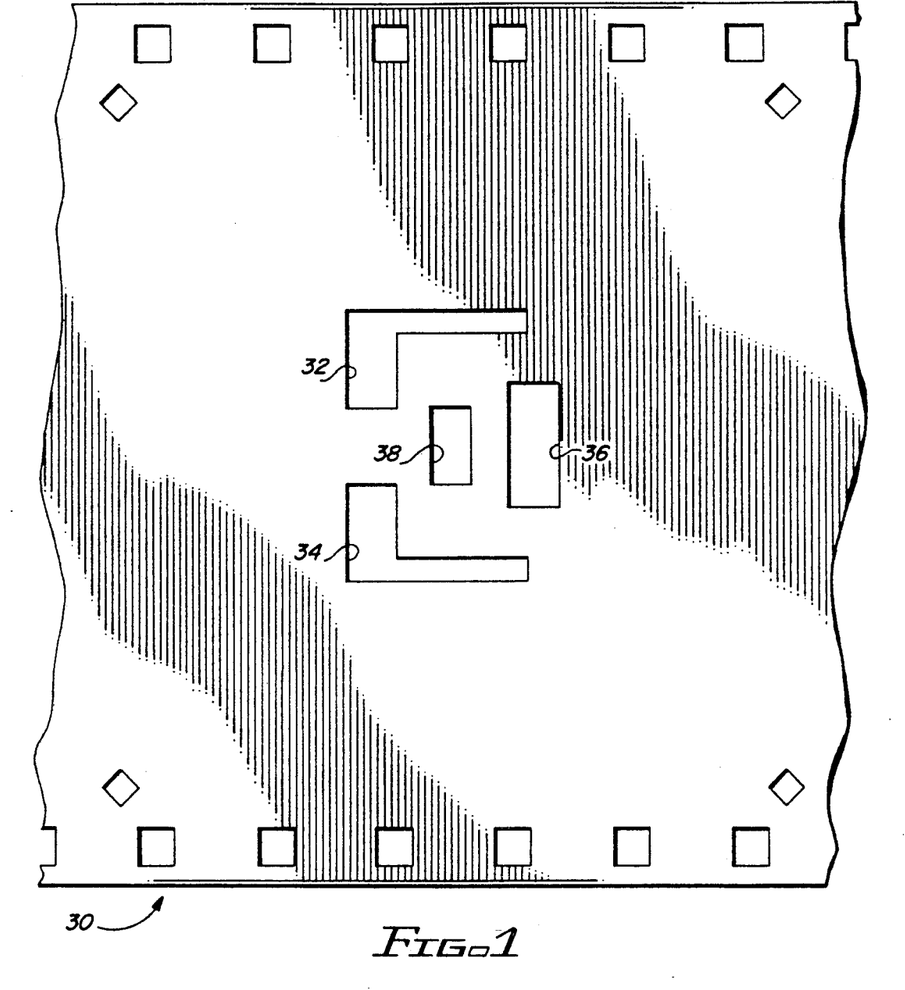
FIG. 1 is a top plan view of a segment of blank tape made of insulating material with several windows punched therein.

Referring first to FIG. 1, a segment of insulating material 30 is illustrated; it will be understood that the segment of insulating material 30 is part of a continuous roll of tape in which the same segment shown will be repeated. The segment of insulating material 30 is made of a material which is an insulator, typically polyimide, which will act as a carrier for the leads (not shown in FIG. 1). The segment of insulating material 30 has four apertures 32, 34, 36, and 38 punched therein.

Figure 2:
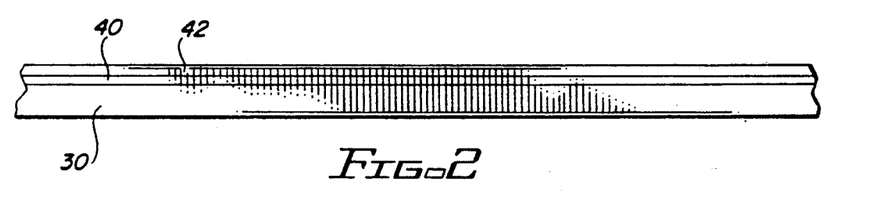
FIG. 2 is a side view of the tape segment shown in FIG. 1, showing a conductive layer attached to an adhesive layer on the layer of insulating material.

Referring now to FIG. 2, it may be seen that the segment of insulating material 30 has a layer of adhesive material 40 thereon which adhesive material also acts as a carrier. Note that the layer of adhesive material 40 may be present on the segment of insulating material 30 when the apertures 32, 34, 36, and 38 are punched therein. A conductive layer 42 is installed on top of the layer of adhesive material 40. The conductive layer 42 is typically made of copper, with gold plating thereon. Note that for the present invention either a two-layer tape or the three-layer tape shown may be utilized. If a two-layer tape (not shown) is used, the apertures 32, 34, 36, and 38 would be chemically etched in the insulating layer.

Figure 3:
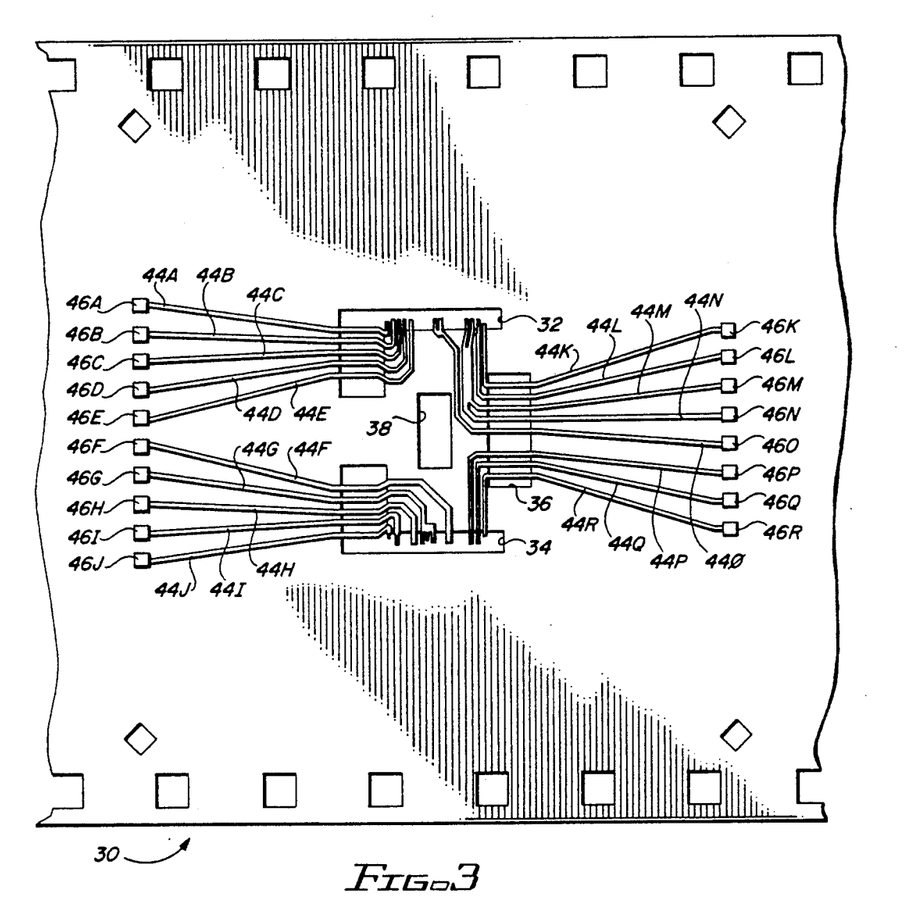
FIG. 3 is plan view of the three-layer tape segment shown in FIG. 2, with the conductive layer etched to form a plurality of leads.

The conductive layer 42 is photo-imaged and etched using standard techniques to produce the desired lead layout. Referring next to FIG. 3, a lead pattern is shown implemented on the segment of insulating material 30. This lead pattern differs radically from previously known patterns in that the leads travel over an area which will be mounted over a semiconductor die (not shown in FIG. 3). Typically, leads used in tape automated bonding processes terminate directed radially outwardly over what will be the edge of the die. In the present invention, the leads extend inwardly over an area which will be mounted over the die.

In the example shown there are eighteen leads 44A, 44B, 44C, 44D, 44E, 44F, 44G, 44H, 44I, 44J, 44K, 44L, 44M, 44N, 44O, 44P, 44Q, and 44R. Each of these leads terminates in a first end portion which extends over the edge of the segment of insulating material 30 into either the aperture 32 or the aperture 34. These portions will be attached to the semiconductor die (not shown in FIG. 3). Intermediate portions of the leads are arranged in three groups.

The intermediate portions of the leads 44A, 44B, 44C, 44D, and 44E extend leftwards over the left portion of the aperture 32. The intermediate portions of the leads 44F, 44G, 44H, 44I, and 44J extend leftwards over the left portion of the aperture 34. The intermediate portions of the leads 44K, 44L, 44M, 44N, 44O, 44P, 44Q, and 44R extend rightward over the aperture 36. These segments of the leads will eventually comprise the second end portions of the leads.

Each of the leads has a test pad associated therewith, which test pads 46A, 46B, 46C, 46D, 46E, 46F, 46G, 46H, 46I, 46J, 46K, 46L, 46M, 46N, 46O, 46P, 46Q, and 46R are located at the ends of the leads 44A, 44B, 44C, 44D, 44E, 44F, 44G, 44H, 44I, 44J, 44K, 44L, 44M, 44N, 44O, 44P, 44Q, and 44R, respectively. As those skilled in the art will well know, it is common to have the leads tied together when they are etched, so that they will all be common. If they are tied together, it will likely be through the test pads.

Figure 4:
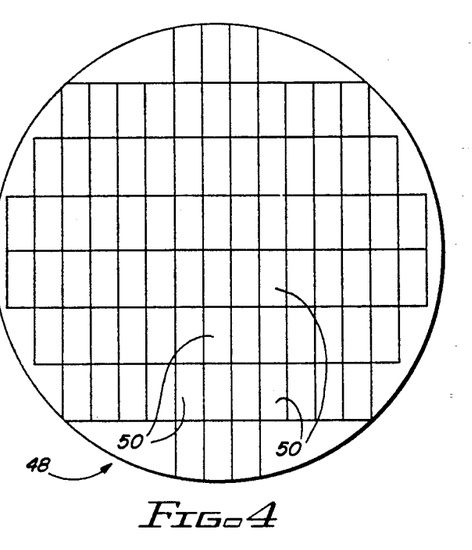
FIG. 4 is a top plan view of a semiconductor wafer etched into a plurality of die.
Figure 5:
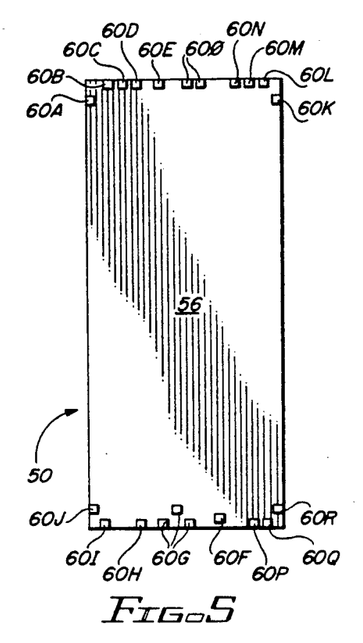
FIG. 5 is a top plan view of one of the die contained in the semiconductor wafer of FIG. 4.
Figure 6:
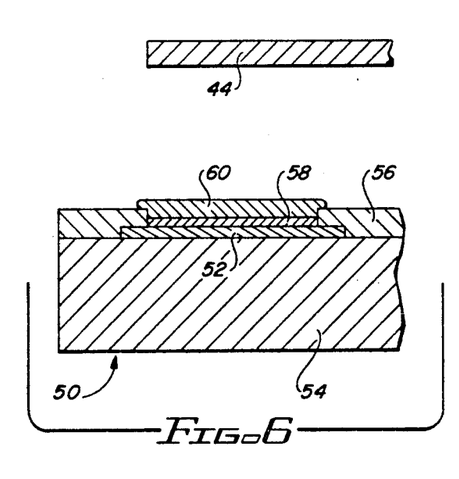
FIG. 6 is a side view of a portion of the die shown in FIG. 5, showing a bump mounted over a terminal pad on the die in a sealing manner, also showing a portion of a flat lead.

Referring next to FIG. 4, an etched semiconductor wafer 48 is illustrated. On the etched semiconductor wafer 48 are a plurality of die 50, one of which is shown in FIG. 5. The die 50 as manufactured has a plurality of terminal pads 52 thereon, which are typically made of aluminum. One of these terminal pads 52 is shown in FIG. 6, mounted on a silicon substrate 54. A passivation layer 56 is located over the top surface of the die 50, leaving openings only where the terminal pads 52 are located. The passivation layer 56 is an insulating layer used to protect the surface of the die 50 from contamination, moisture, and foreign particles, and is typically made of silicon nitride (preferred), silicon oxide, or doubly-applied polyimide.

In tape automated bonding, a bump must be installed either on each of the terminal pads 52 (FIG. 6), or on each of the leads 44 (FIG. 3). In the preferred embodiment, the bumps are installed on the terminal pads 52. As shown in FIG. 6, in the preferred embodiment the die 50 is manufactured with a smaller window in the passivation layer 56 above each of the terminal pads 52, so that the passivation layer 56 overlies a portion of each of the terminal pads 52 on the periphery thereof. An adhesion layer of metal 58 is plated over the terminal pads 52, and a bump 60 is plated over the adhesion layer of metal 58.

The bump 60 is typically made of gold for good adhesion characteristics. The bump 60 hermetically seals the window in the passivation layer 56 since the top of the bump 60 is larger than the window in the passivation layer 56. Typically the bumps 60 are installed on the die 50 before the etched semiconductor wafer 48 is separated into individual die. In FIG. 5, twenty-one bumps are designated 60A, 60B, 60C, 60D, 60E, 60F, 60G (three bumps), 60H, 60I, 60J, 60K, 60L, 60M, 60N, 60O (two bumps), 60P, 60Q, and 60R.

The next step is inner-lead bonding, in which the first end portions of the leads 44A, 44B, 44C, 44D, 44E, 44F, 44G, 44H, 44I, 44J, 44K, 44L, 44M, 44N, 44O, 44P, 44Q, and 44R are bonded onto the bumps 60A, 60B, 60C, 60D, 60E, 60F, 60G (three bumps), 60H, 60I, 60J, 60K, 60L, 60M, 60N, 60O (two bumps), 60P, 60Q, and 60R, respectively (one such end of a lead 44 is illustrated in FIG. 6). The die 50 (FIG. 5) is positioned with respect to the segment of insulating material 30 (FIG. 3), and the inner-lead bonding process is performed. This operation may be performed sequentially by thermocompression bonding, thermosonic bonding, ultrasonic bonding, laser bonding, or reflow bonding. It may also be performed simultaneously by thermocompression bonding or reflow bonding.

As mentioned above, it is common to have the leads tied together when they are etched, so that they will all be common (although this configuration is not shown in the drawings). If this type of construction is used, the common connectors may at this point be excised to separate the leads into individual leads. Testing and burning in may then be performed on the die 50, using the test pads 46A, 46B, 46C, 46D, 46E, 46F, 46G, 46H, 46I, 46J, 46K, 46L, 46M, 46N, 46O, 46P, 46Q, and 46R (FIG. 3).

Figure 7:
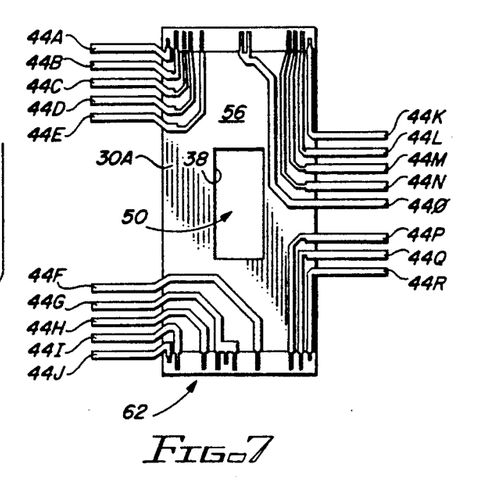
FIG. 7 is a top plan view of the three-layer tape segment of FIG. 3 inner-lead bonded to the die shown in FIG. 5, with the leaded die excised from the tape carrier.

Following testing, the die 50 together with the leads (which will be referred to as the leaded die 62) may be removed from the rest of the segment of insulating material 30. The leads 44A, 44B, 44C, 44D, and 44E are cut over the left edge of the aperture 32 (FIG. 3). The leads 44F, 44G, 44H, 44I, and 44J are cut over the left edge of the aperture 34. The leads 44K, 44L, 44M, 44N, 44O, 44P, 44Q, and 44R are cut over the right edge of the aperture 36. This forms the second end portions of the leads. The segment of insulating material 30 is cut around the outline of the die 50, leaving a smaller segment of insulating material 30A. The resulting leaded die 62 appears as shown in FIG. 7.

As noted above, the construction of the leaded die 62 differs substantially from the previously known technique. Previous technique was to have the leads emanate radially outwardly from the edge of the die. The present invention actually does the opposite in that the leads emanate inwardly instead of outwardly, eventually changing direction and coming out over the die. This radical difference in design has the beneficial effect of providing greater strength.

In the preferred embodiment, an encapsulation layer 64 (FIGS. 8 and 9) is placed on the top of the leaded die 62. The aperture 38 is provided for this purpose; an encapsulate material is flowed through the aperture 38 to cover the top of the die 50. The encapsulate material is also flowed over the top of the smaller segment of insulating material 30A and those portions of the leads 44 located above the die 50. The encapsulate material may be an epoxy, a silicone, or a polyimide. The encapsulation layer combined with the fact that the leads go inwardly on the die results in a lead strength which is substantially greater than anything previously known in the art.

Figure 8:
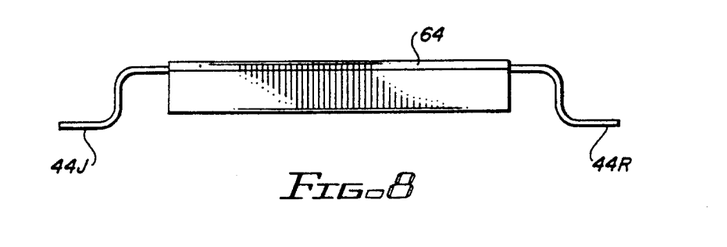
FIG. 8 is a side view of the leaded die of FIG. 7, with the leads formed for mounting on a printed circuit board, also showing the encapsulation layer over the top of the die.
Figure 9:
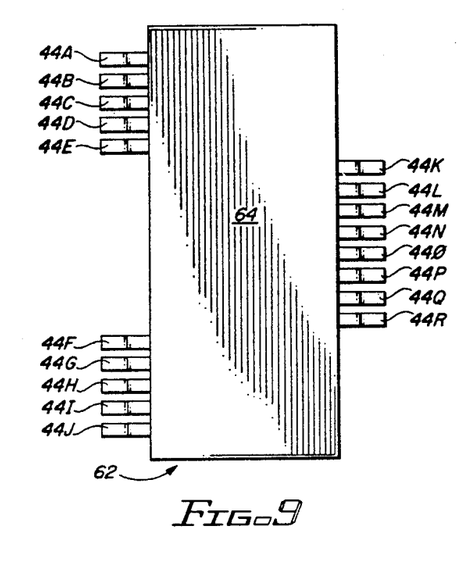
FIG. 9 is a top plan view of the fully assembled leaded die shown in FIG. 8.

Referring now to FIG. 8, the conductors 44 which extend from the sides of the leaded die 62 are bent as shown to prepare the leaded die 62 for installation onto a printed circuit board. This is referred to as a formed mount. (Alternately, the leads 44 may be left straight, and the leaded die 62 may be installed in an upside-down position in an inverse or "flip" mount, or over an aperture which will receive the die 50 in a flat mount.) The leaded die 62 is now completed, and ready for installation onto a printed circuit board.

Figure 10:
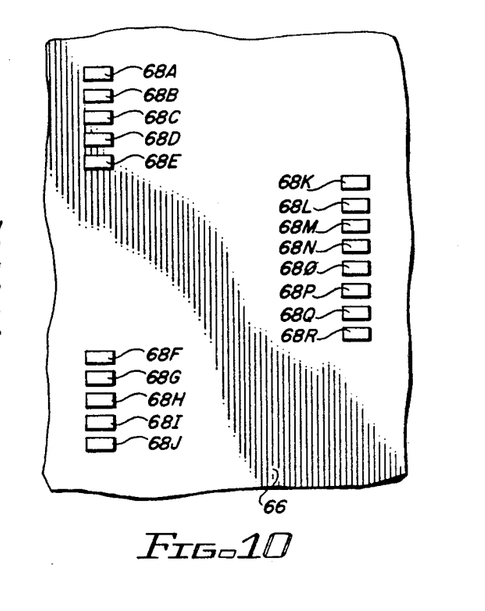
FIG. 10 is a top plan view of a portion of a printed circuit board showing the lands for receiving the outer leads of the fully assembled leaded die shown in FIG. 9.

Referring next to FIG. 10, a portion of a printed circuit board 66 is shown which has eighteen lands 68A, 68B, 68C, 68D, 68E, 68F, 68G, 68H, 68I, 68J, 68K, 68L, 68M, 68N, 68O, 68P, 68Q, and 68R mounted thereon in position for receiving the eighteen leads 44A, 44B, 44C, 44D, 44E, 44F, 44G, 44H, 44I, 44J, 44K, 44L, 44M, 44N, 44O, 44P, 44Q, and 44R of the leaded die 62 (FIG. 9), respectively. The leaded die 62 of FIG. 9 may be mounted on the printed circuit board 66 with or without adhesive. Adhesive is useful in certain applications to provide a heat channel between the die 50 and the printed circuit board 66.

With the leaded die 62 properly positioned with respect to the printed circuit board 66, the outer-lead bonding process may be performed. This operation may be performed sequentially by thermocompression bonding, thermosonic bonding, ultrasonic bonding, reflow bonding, or through the use of conductive adhesives. It may also be performed simultaneously by thermocompression bonding, reflow bonding, or through the use of conductive adhesives.

Figure 11:
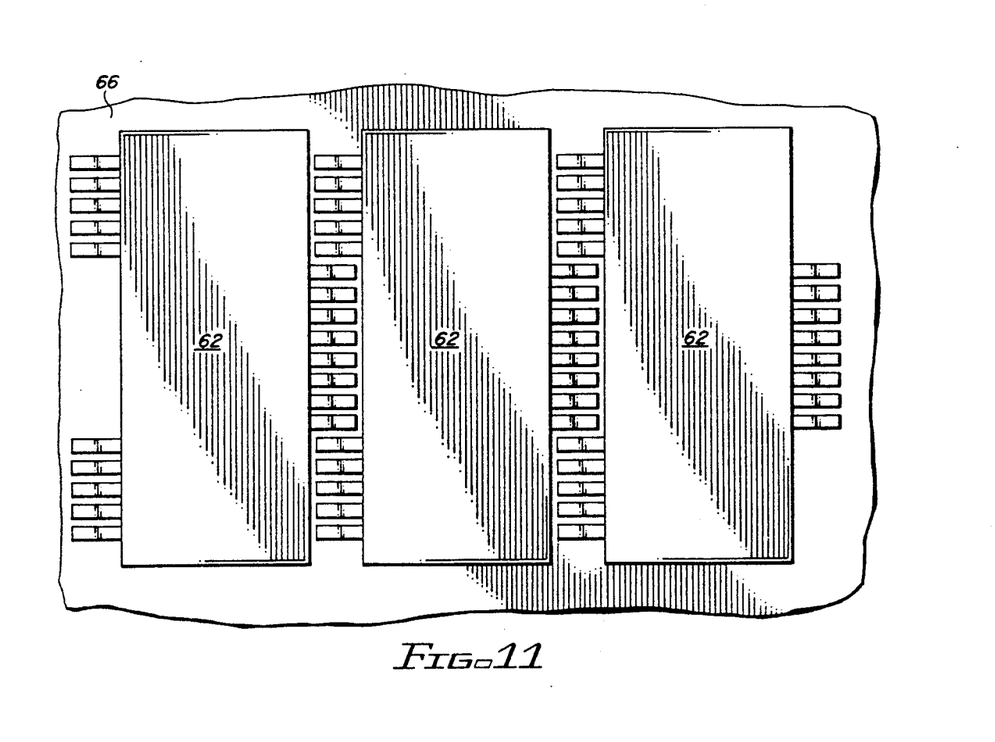
FIG. 11 is a top plan view showing three of the leaded die of FIG. 9 installed in interdigitated fashion on a printed circuit board.

A number of applications, such as memory cards, call for a number of the leaded die 62 to be installed in close proximity on a printed circuit board. Referring next to FIG. 11, the utility of the present invention will be made readily apparent. Three leaded die 62 are shown installed on the printed circuit board 66. Note that the leads on the right side of the left-most leaded die 62 fit between the leads on the left side of the center leaded die 62. Similarly, the leads on the right side of the center leaded die 62 fit between the leads on the left side of the right-most leaded die 62. Thus, the leaded die 62 may be installed in a significantly higher density than was possible with previous assembly techniques.

Figure 12:
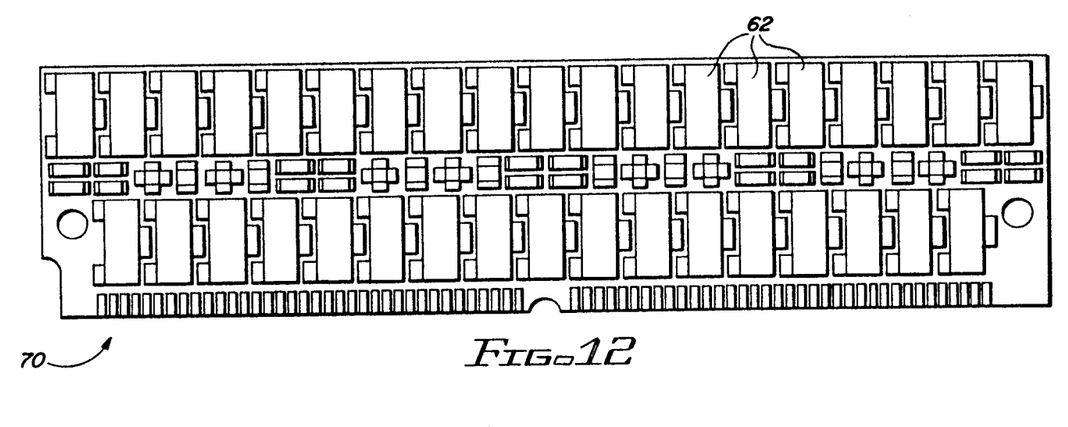
FIG. 12 is a front plan view of an 8M memory board using the interdigitated assembly of the present invention.
Figure 13:
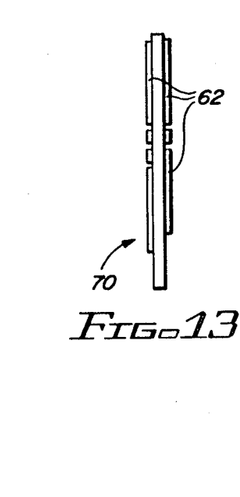
FIG. 13 is a side view of the 8M memory board of FIG. 12.
Figure 14:
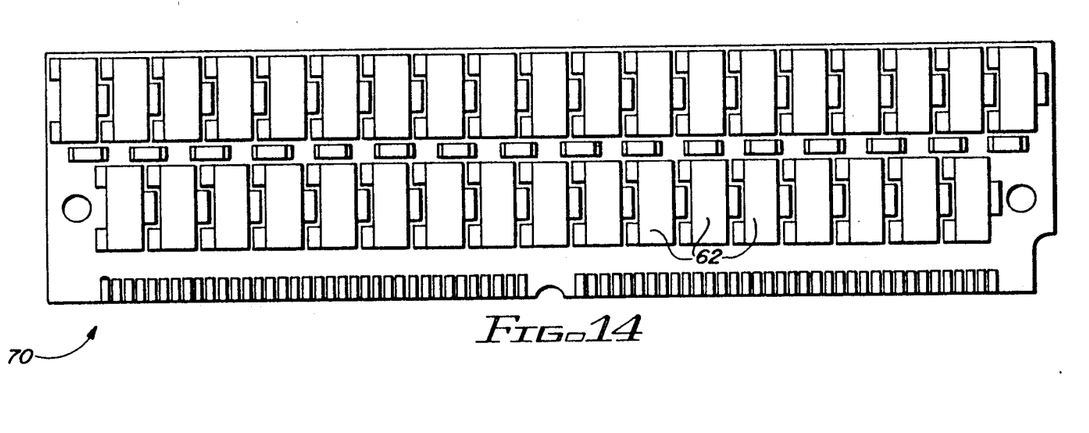
FIG. 14 is a back plan view of the 8M memory board of FIGS. 12 and 13.

Referring next to FIGS. 12 through 14, an example of the utility of the present invention is illustrated. An 8M memory card 70 is illustrated having 36 leaded die 62 (and other components unimportant in this context) installed on each side of the card 70. The dimensions of the card 70 are 4.25 inches long by 1 inch high by 0.1 inches thick. This is considerably smaller than possible with previous technology.

Figure 15:
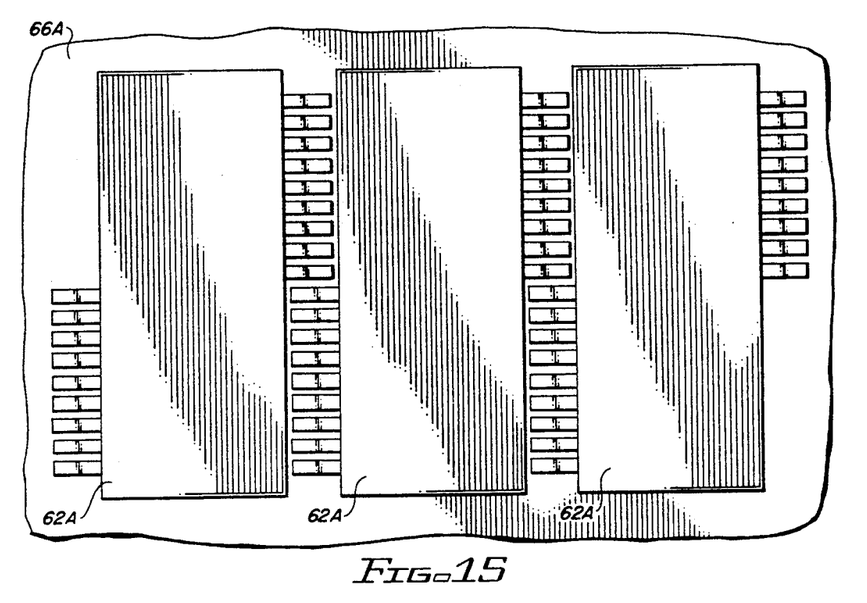
FIG. 15 is a top plan view showing three leaded die of a first alternate embodiment interdigitated lead design on a printed circuit board.

Referring next to FIG. 15, a first alternate embodiment is illustrated which has the leads on the left side of a leaded die 62A emanating from the bottom half of the left side of the leaded die 62A. Leads on the right side of the leaded die 62A emanate from the top half of the right side of the leaded die 62A. Thus the leads may be interdigitated when the leaded die 62A are installed.

Figure 16:
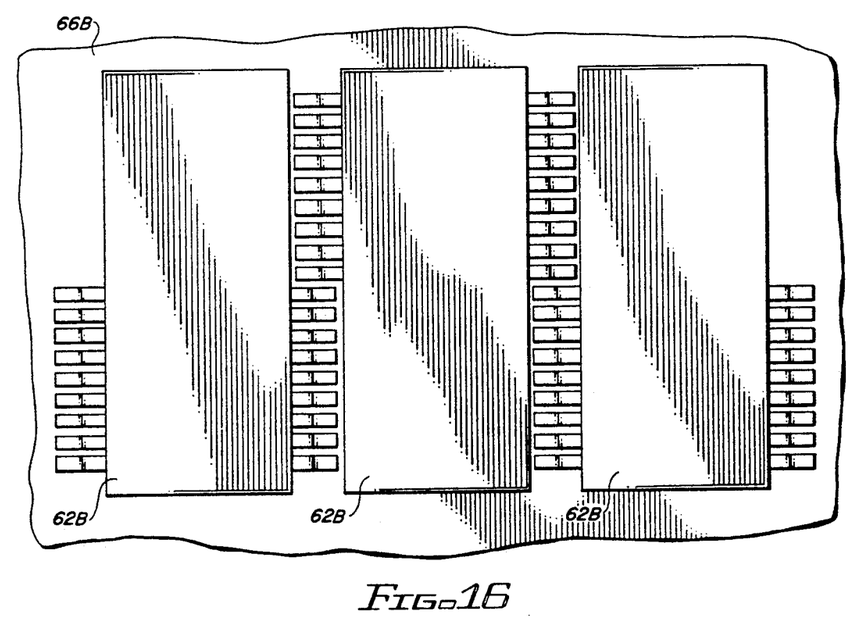
FIG. 16 is a top plan view showing three leaded die of a second alternate embodiment interdigitated lead design on a printed circuit board.

Referring now to FIG. 16, a second alternative embodiment is illustrated in which the leads on both the left side and the right side of a leaded die 62B emanate from the bottom half (or alternately the top half) of the leaded die 62B. Alternating leaded die 62B are inverted when the leaded die 62B are mounted, as shown. Thus the leads may be interdigitated when the leaded die 62B are installed.

It may therefore be appreciated from the above detailed description of the preferred embodiment of the present invention that it teaches an expansion of the chip-on-board and tape automated bonding technologies which is utilized to further minimize the board area required to mount chips. The present invention thus reduces to an absolute minimum the board space required to mount chips, thereby maximizing density to the greatest degree possible. In increasing the density of chip mounting, none of the advantages obtained through tape automated bonding are sacrificed to any degree. The cost of the increased density is minimal, thus enabling the more compact designs to be sold at a price not significantly higher than competing lower density designs. Finally, all of the aforesaid advantages and objectives are achieved without incurring any substantial relative disadvantage.

Although an exemplary embodiment of the present invention has been shown and described, it will be apparent to those having ordinary skill in the art that a number of changes, modifications, or alterations to the invention as described herein may be made, none of which depart from the spirit of the present invention. All such changes, modifications, and alterations should therefore be seen as within the scope of the present invention.

What is claimed is:

1. A method of attaching leads to a semiconductor die having a plurality of terminal pads about the periphery thereof, comprising:
   providing a tape comprising a thin, flat layer of insulating material having a thin, flat layer of conductive material disposed thereon, said layer of insulating material having a plurality of apertures therein;
   removing a portion of the layer of conductive material to form a plurality of conductive leads each having a first end and a second end, said first end of each of said leads extending over an aperture in said layer of insulating material, said second end of each of said leads extending over an aperture in said layer of insulating material;
   positioning said semiconductor die below said tape with said first ends of said leads each extending over a corresponding terminal pad on said semiconductor die, the portion of each of said leads adjacent said first end of each of said leads extending inwardly from the periphery of said semiconductor die over the surface of said semiconductor die, said second end of each of said leads extending outwardly from the periphery of said semiconductor die;
   electrically connecting each of said first ends of said leads to the corresponding terminal pad on said semiconductor die said first end of said lead extends over; and
   cutting said tape to remove said semiconductor die, the portion of said layer of conductive material above said semiconductor die, and said leads from said tape.

2. A method as defined in claim 1, wherein said tape is a two-layer tape automated bonding tape.

3. A method as defined in claim 2, wherein said apertures in said layer of insulating material are chemically etched.

4. A method as defined in claim 1, wherein said tape is a three-layer tape automated bonding tape having an intermediate layer of adhesive between said layer of insulating material and said layer of conductive material.

5. A method as defined in claim 4, wherein said apertures in said layer of insulating material are punched prior to said layer of conductive material being installed on said layer of insulating material.

6. A method as defined in claim 1, wherein said removing step is performed using a photo imaging and etching process.

7. A method as defined in claim 1, wherein said insulating layer is made of polyimide.

8. A method as defined in claim 1, wherein said layer of conductive material is made of copper.

9. A method as defined in claim 8, wherein said layer of conductive material is plated with gold.

10. A method as defined in claim 1, additionally comprising:
    bumping said terminal pads on said semiconductor die prior to said positioning step.

11. A method as defined in claim 10, wherein said bumping step is performed using gold as the material for bumping said terminal pads on said semiconductor die.

12. A method as defined in claim 10, wherein said top surface of said semiconductor die is covered by a passivation layer leaving openings only where said terminal pads are located, said passivation layer overlying a portion of each of said terminal pads on the periphery thereof, and wherein the bump produced by said bumping step overlies a portion of said passivation layer, thereby providing a hermetic seal.

13. A method as defined in claim 12, wherein said passivation layer is made of silicon nitride.

14. A method as defined in claim 1, additionally comprising:
    bumping said first ends of said conductive leads on the side facing said layer of insulating material prior to said positioning step.

15. A method as defined in claim 1, wherein said electrically connecting step comprises:
    sequentially bonding each of said first ends of said conductive leads to a corresponding terminal pad on said semiconductor die using a process from the group consisting of thermocompression bonding, thermosonic bonding, ultrasonic bonding, laser bonding, and reflow bonding.

16. A method as defined in claim 1, wherein said electrically connecting step comprises:
    simultaneously bonding each of said first ends of said conductive leads to a corresponding terminal pad on said semiconductor die using a process from the group consisting of thermocompression bonding and reflow bonding.

17. A method as defined in claim 1, additionally comprising:
    testing said semiconductor die after said electrically connecting step and before said cutting step.

18. A method as defined in claim 1, additionally comprising:
    burning in said semiconductor die after said electrically connecting step and before said cutting step.

19. A method as defined in claim 1, additionally comprising:
    encapsulating the top of said semiconductor die using an encapsulate material covering said layer of insulating material and the portions of said leads located above said semiconductor die.

20. A method as defined in claim 19, wherein an aperture is located in said layer of insulating material to allow said encapsulate material to flow therethrough to cover the top of said semiconductor die.

21. A method as defined in claim 19, wherein said encapsulate material is made of an element from the group consisting of epoxy, silicone, and polyimide.

22. A method as defined in claim 1, additionally comprising:
    bending said second ends of said leads in gull wing fashion to facilitate installation of said semiconductor die on a printed circuit board.

23. A method as defined in claim 1, additionally comprising:
grouping said second ends of said leads to facilitate interdigitation of leads on adjacent ones of said semiconductor die.

24. A method as defined in claim 23, wherein said second ends of said leads are grouped in first, second, and third groups extending from a first and second opposite sides of said semiconductor die, said first and second sides each having a first end and a second end, said first group of leads emanating from the portion of said first side of said semiconductor die adjacent said first end, said second group of leads emanating from the portion of said first side of said semiconductor die adjacent said second end, said third group of leads emanating from a central portion of said second side of said semiconductor die intermediate said first and second ends.

25. A method as defined in claim 23, wherein said second ends of said leads are grouped in first and second groups extending from a first and second opposite sides of said semiconductor die, said first and second sides each having a first end and a second end, said first group of leads emanating from the portion of said first side of said semiconductor die adjacent said first end, said second group of leads emanating from the portion of said second side of said semiconductor die adjacent said second end.

26. A method as defined in claim 23, wherein said second ends of said leads are grouped in first and second groups extending from a first and second opposite sides of said semiconductor die, said first and second sides each having a first end and a second end, said first group of leads emanating from the portion of said first side of said semiconductor die adjacent said first end, said second group of leads emanating from the portion of said second side of said semiconductor die adjacent said first end.

27. A method of attaching leads to a semiconductor die having a plurality of terminal pads about the periphery thereof, comprising:
providing a tape comprising a thin, flat layer of insulating material having a thin, flat layer of conductive material disposed thereon, said layer of insulating material having a plurality of apertures therein;
removing a portion of the layer of conductive material to form a plurality of conductive leads each having a first end and a second end, said first end of each of said leads extending over an aperture in said layer of insulating material, said second end of each of said leads extending over an aperture in said layer of insulating material;
bumping said terminal pads on said semiconductor die with gold;
positioning said semiconductor die below said tape with said first ends of said leads each extending over a corresponding terminal pad on said semiconductor die, the portion of each of said leads adjacent said first end of each of said leads extending inwardly from the periphery of said semiconductor die over the surface of said semiconductor die, said second end of each of said leads extending outwardly from the periphery of said semiconductor die, said second ends of said leads being grouped in first, second, and third groups extending from a first and second opposite sides of said semiconductor die to facilitate interdigitation of leads on adjacent ones of said semiconductor die, said first and second sides each having a first end and a second end, said first group of leads emanating from the portion of said first side of said semiconductor die adjacent said first end, said second group of leads emanating from the portion of said first side of said semiconductor die adjacent said second end, said third group of leads emanating from a central portion of said second side of said semiconductor die intermediate said first and second ends;
electrically connecting each of said first ends of said leads to the corresponding terminal pad on said semiconductor die said first end of said lead extends over; and
cutting said tape to remove said semiconductor die, the portion of said layer of conductive material above said semiconductor die, and said leads from said tape.

28. A method of attaching leads to a semiconductor die having a plurality of terminal pads about the periphery thereof, comprising:
providing a tape comprising a thin, flat layer of insulating material having a thin, flat layer of conductive material disposed thereon, said layer of insulating material having a plurality of apertures therein;
removing a portion of the layer of conductive material to form a plurality of conductive leads each having a first end and a second end, said first end of each of said leads extending over an aperture in said layer of insulating material, said second end of each of said leads extending over an aperture in said layer of insulating material;
bumping said terminal pads on said semiconductor die with gold;
positioning said semiconductor die below said tape with said first ends of said leads each extending over a corresponding terminal pad on said semiconductor die, the portion of each of said leads adjacent said first end of each of said leads extending inwardly from the periphery of said semiconductor die over the surface of said semiconductor die, said second end of each of said leads extending outwardly from the periphery of said semiconductor die, said second ends of said leads being grouped to facilitate interdigitation of leads on adjacent ones of said semiconductor die;
electrically connecting each of said first ends of said leads to the corresponding terminal pad on said semiconductor die said first end of said lead extends over; and
cutting said tape to remove said semiconductor die, the portion of said layer of conductive material above said semiconductor die, and said leads from said tape.

29. A method of attaching leads to a semiconductor die having a plurality of terminal pads, comprising:
providing a tape comprising a layer of insulating material having a layer of conductive material disposed thereon, said layer of insulating material having a plurality of apertures therein;
removing a portion of the layer of conductive material to form a plurality of conductive leads each having a first end and a second end, said first and second ends of each of said leads each extending over an aperture in said layer of insulating material;
electrically connecting each of said first ends of said leads to a corresponding terminal pad on said semiconductor die, the portion of each of said leads adjacent said first end of each of said leads extending inwardly from the periphery of said semiconductor die over the surface of said semiconductor die, said second end of each of said leads extending outwardly from the periphery of said semiconductor die; and cutting said tape to remove said semiconductor die, the portion of said layer of conductive material above said semiconductor die, and said leads from said tape.

30. A method of fabricating a semi-conductor die having a plurality of leads connected thereto comprising:

a) providing a die having a plurality of terminal pads, and a plurality of sides;

b) providing a plurality of leads, each of which have a rearward portion connected to a rear end and a forward portion connected to a forward end, c) positioning said leads over said die so that:
1) said rearward portion extends over said die from the periphery of one side thereof inwardly of said die, and
2) said forward portion extends over said die from the interior thereof outwardly to the periphery thereof at a side other than said one side, and d) connecting each said rear end of said leads to each terminal pad on one side of said die at the periphery thereof.

31. The method of claim 30 wherein said leads are in the form of a tape.

32. The method of claim 31 wherein said tape includes an insulative support layer for said leads.

33. The method of claim 32 wherein said support layer is disposed between the leads and said die.

* * * * *